United States Patent [19]

Ferry et al.

[11] Patent Number: 5,146,306
[45] Date of Patent: Sep. 8, 1992

[54] SEMICONDUCTOR FET STRUCTURES WITH SLEW-RATE CONTROL

[75] Inventors: Thomas V. Ferry, San Jose; Jamil Kawa, Santa Clara; Kerry M. Pierce, Fremont; William G. Walker, Saratoga; James S. Hsue, San Francisco, all of Calif.

[73] Assignee: VLSI Technology, Inc, San Jose, Calif.

[21] Appl. No.: 638,629

[22] Filed: Jan. 8, 1991

Related U.S. Application Data

[63] Continuation-in-part of Ser. No. 316,894, Feb. 28, 1989, abandoned.

[51] Int. Cl.⁵ .............................................. H01L 27/02
[52] U.S. Cl. ................................. 357/41; 357/59; 357/45; 357/40; 307/443; 307/448; 307/571; 307/572
[58] Field of Search ................... 357/41, 24, 23, 23.14, 357/51, 59 F, 40, 45; 307/572, 579, 443, 448

[56] References Cited

U.S. PATENT DOCUMENTS

| | | | |
|---|---|---|---|
| 4,462,041 | 7/1984 | Glenn | 357/23 |
| 4,500,845 | 2/1985 | Ehni | 357/51 |
| 4,771,195 | 9/1988 | Stein | 357/23.14 |
| 4,949,139 | 8/1990 | Korsh et al. | 307/579 |

OTHER PUBLICATIONS

Semiconductor Devices by S. M. Sze pp. 376–377.

Primary Examiner—William Mintel
Assistant Examiner—Roy Potter
Attorney, Agent, or Firm—Majestic, Parson, Siebert & Hsue

[57] ABSTRACT

Slew-rate control is implemented in input/output device structures where MOSFETs are employed to switch the output signal. These MOSFETs each have a substrate, an insulating layer adjacent to the substrate and a strip of semiconductor material separated from the substrate by the insulating layer. The strip of semiconductor material functions as the gate of the MOSFET. The strip of semiconductor material does not form a closed loop. One end of the strip of a first transistor is connected to one end of the strip of the second transistor. Thus, the gates of the two transistors are placed in series so that they are not switched on at the same time. A delay is thereby automatically introduced between the switching on of the two transistors. The delay is controlled by placing metal straps across selected transistor gates to effectively bypass the delays caused by the current propagating through the gates. Further control of the delay is gained by use of a feedback signal to increase or decrease the current in the gates.

20 Claims, 10 Drawing Sheets

--- = POLY

SEMICONDUCTOR FET STRUCTURES WITH SLEW-RATE CONTROL

CROSS-REFERENCE TO RELATED APPLICATION

This is a continuation-in-part of application Ser. No. 07/316,894, filed Feb. 28, 1989 and now abandoned.

BACKGROUND OF THE INVENTION

This invention relates in general to semiconductor structures and in particular to semiconductor structures with slew-rate control.

Semiconductor devices employ output buffers for driving external circuits. The switching currents present in such devices when they are changing states is the major source of noise spikes on power busses. This noise can cause erroneous switching in TTL logic buffers and other clocked macrocells. Also this noise can induce latch up to other driven chips. These output devices are frequently required to drive heavy loads. For this reason such devices frequently have to meet certain DC drive requirements. Hence, even though noise spikes can be reduced by reducing the size of these output devices, smaller devices are not capable of driving the heavy loads required. It is therefore desirable to provide slew-rate control to slow down the output devices in a manner that will reduce the rate of change of output voltage and peak current value while maintaining the DC output drive capability of these devices.

Slew rate is defined as the rate of output transition in volts per unit time. For output devices to have high DC drive capability, these devices normally employ two or more elements placed in parallel. Conventional slew rate control employs delay elements between parallel devices.

The inclusion of delay elements requires a considerable amount of area in the semiconductor medium in which the output device is implemented. This area penalty becomes increasingly more costly as the output area becomes the size limiting factor in submicron technology due to the fact that the ESD area requirements are non-shrinkable and most circuit architectures become pad limited. It is therefore desirable to provide semiconductor structures with slew-rate control where the above-described difficulties are alleviated.

SUMMARY OF THE INVENTION

In conventional output device structures with no slew-rate control, the input signal is fed to the gates of the parallel transistors simultaneously. All the parallel transistors will therefore change states at the same time causing abruptness in transition. This gives rise to large peak noise voltages and currents. In other conventional output device structures with slew-rate control, while peak noise voltages and currents are reduced relative to structures with no slew-rate control, the slew rate of the structure is not independent of the DC output current drive capability. In other words, the only way to vary the slew-rate rates is to add or delete transistors. This restricts the overall design flexibility and is undesirable.

This invention is based on the observation that it is desirable to separate the slew rates achievable from the drive capability of the structure. This may be accomplished by using bypass means for selectively bypassing some but not all of the transistors to achieve the desirable slew rates without having to add or delete transistors from the structure. By permitting the bypassing of transistors and their corresponding RC delays, a high degree of design flexibility is achieved. If more transistors switch in parallel, the slew-rate is increased. If fewer transistors switch simultaneously, the slew-rate is decreased. The slew-rate can be even more precisely controlled by providing a feedback signal from the output of the device to one or more of the transistor gate interconnections. In this manner the current at the interconnections is controlled to achieve the desired slew-rate. The various aspects of the invention are described in more detail below.

The overall semiconductor structure of this invention comprises means for applying a signal to switch the structure and a plurality of MOSFETs whose drains are connected to an output pad wherein the gate of each of the MOSFETs is elongated and has a near end and a far end. The structure further comprises electrically conductive means for connecting the far end of the gate of at least one transistor to the near end of the gate of a succeeding transistor, thereby forming a continuous chain of transistor gates with one or more nodes between adjacent gates in the chain. The transistors with gates in the chain form a sequence. Thus when the signal is applied to the near end of the gate of a transistor in the sequence, the applied signal will propagate along the length of the gates of the transistors in the chain in the order of the sequence, so that the transistor in the sequence is switched on by the signal before a succeeding transistor in the sequence. This invention contemplates the addition of one or more elements to the above-described overall semiconductor structure to improve slew-rates control.

According to a first aspect of the invention, bypassing means is provided for enabling a signal applied to switch the structure to bypass at least one of the transistors in the sequence, thereby reducing the delay of switching of transistors in the sequence succeeding the at least one transistor.

Where feedback is used to achieve the desired slew-rate, the structure further comprises feedback means connected between the output pad and one or more nodes on the chain of transistor gates to affect the timing of the switching of the transistors.

According to another aspect of the invention, the combinations of simultaneous and series interconnections of transistor gates may be achieved by using programmable means such as fuses which enable a user to select one of a number of combinations of interconnections. For this purpose to the overall general structure described above, two additional elements are provided. Electrically conductive paths are provided to connect the near and far ends of the gates of all of the transistors in the sequence, where the paths have higher electrical conductance than the gates of the transistors in the sequence to thereby short-circuit these gates. The second element added is programmable means for enabling the user to disable at least one of the paths, thereby permitting the user to select the desired delay of switching of transistors in the sequence.

According to yet another aspect of the invention, in the overall structure described above, the electrically conductive means for connecting the gates of the transistors includes a first and a second type of paths, where the two types of paths have different electrical conductances.

DETAILED DESCRIPTION OF THE INVENTION

Figure 1:
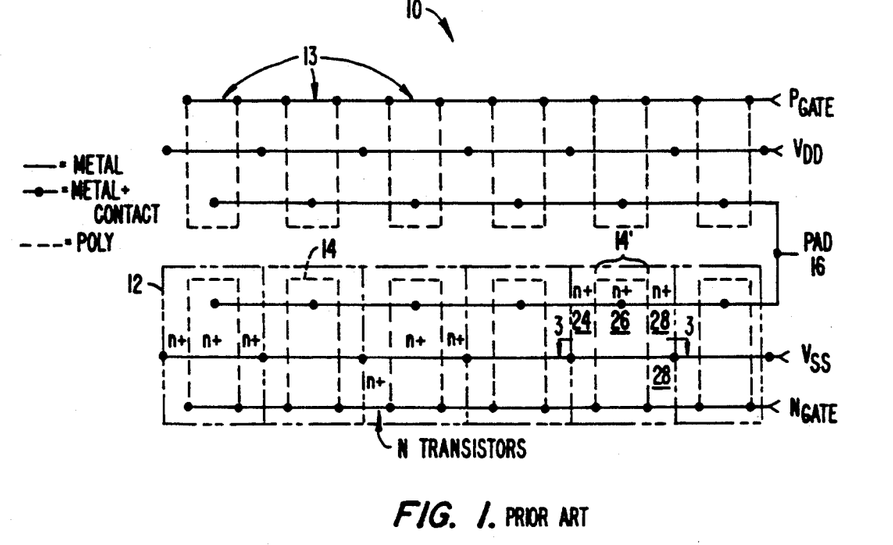
FIG. 1 is a schematic diagram showing the layout of an output semiconductor structure with no slew-rate control to illustrate a conventional output device.

FIG. 1 is a schematic layout of a CMOS output semiconductor structure to illustrate a conventional output device with no slew-rate control. As shown in FIG. 1, device 10 comprises 6 P-transistors and 6 N-transistors forming 6 pairs of pullup and pulldown transistors for driving a load (not shown) connected to the pad. As shown in FIG. 1, each N-type transistor 12 includes n+ doped regions in a P-well or substrate (not shown) and polysilicon strip 14 serving as the gate of the transistor.

The polysilicon gates of adjacent transistors are connected through a metal connection. The round dots of FIG. 1 are metal contacts for facilitating the connection of such layers to a metal layer for easier outside control. For example, the metal contacts connected to the polysilicon gates of the transistors may be connected to the same metal layer which forms the node NGATE. The metal contacts connected to rail $V_{ss}$ are connected to a metal layer which is in turn connected to the metal contacts for the n+ diffusion regions forming the source regions of the transistors. Pad 16 may also be connected to a metal layer which is connected to the metal contacts for the n+ diffusion regions forming the drains of the transistors. The method for implementing such different regions in the substrate, the metal contacts and connections is conventional and need not be elaborated here.

Figure 3:
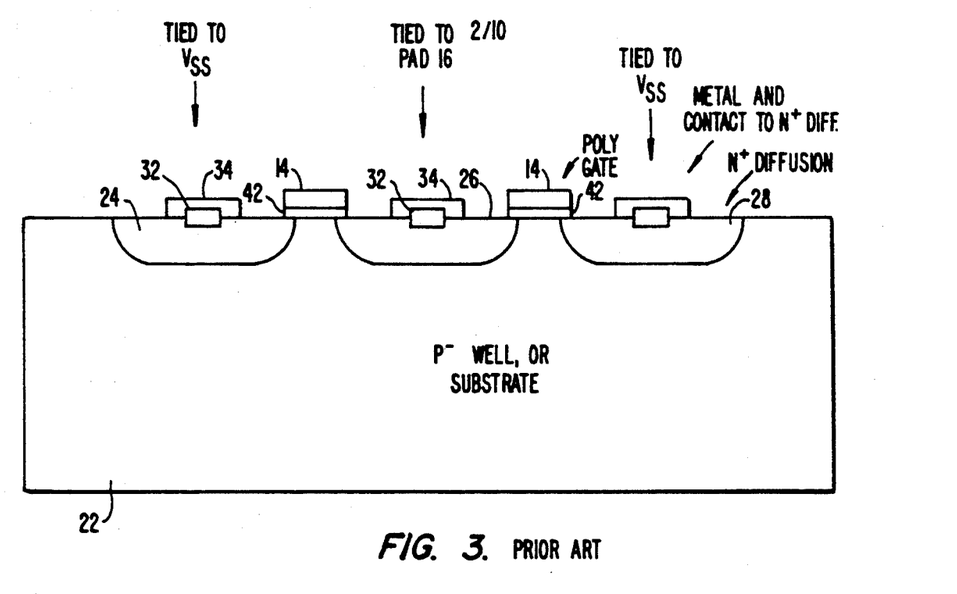
FIG. 3 is a cross-sectional view taken along the line 3—3 in FIG. 1.

FIG. 3 is a cross-sectional view taken along the line 3—3 of FIG. 1 to illustrate in more detail the construction of the N-transistors 12. As shown in FIG. 3, transistors 12 are formed in a substrate 22 with n+ diffusion regions 24, 26 and 28. Each of the n+ diffusion regions is connected to metal 34 and contact 32. N+ diffusion regions 24 and 28 are connected through metal layers (not shown in FIG. 3) to the $V_{ss}$ rail through metal 34 and contact 32. The rail $V_{ss}$ may be tied to ground. The n+ region 26 is connected to pad 16 through metal 34 and contact 32. Region 26 acts as the drain and regions 24, 28 are the sources of transistors 12. Polysilicon gates 14 are separated from the substrate 22 by layers 42 of insulating material.

As will be noted from FIG. 1, the strip of semiconductor material 14 is shown as a line. It will be understood, however, that the polysilicon strip will have a width and thickness which are represented more accurately in FIG. 3. Thus, all the drains of transistors 12 are connected to pad 16 and their sources to the $V_{ss}$ rail. Similarly, the drains of P-transistors 18 are also connected to pad 16 and their sources tied to rail $V_{DD}$. Hence the six pairs of pullup and pulldown transistors are connected in parallel to provide enough drive current for driving loads connected to pad 16. Thus, signals are fed at inputs PGATE, NGATE to the gates of the transistors 12, 18 to switch the transistors on or off and the output of device 10 is at pad 16.

Figure 2:
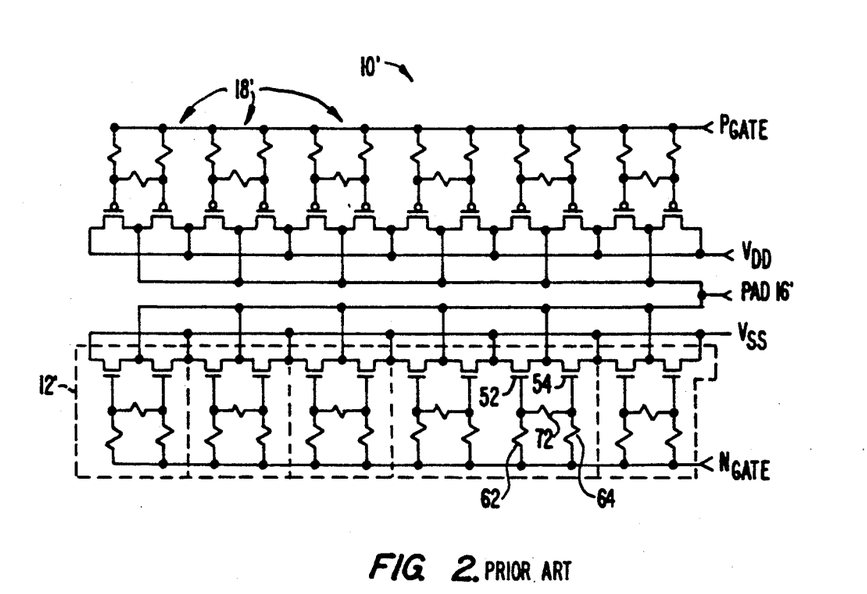
FIG. 2 is a schematic view of an output device which is a functional equivalent of the device of FIG. 1.

FIG. 2 is a schematic circuit diagram of a CMOS output device 10' which is substantially equivalent to device 10 in function. In reference to FIG. 3, the polysilicon gate 14 is separated from the substrate by an insulating layer 42; the polysilicon gate and the substrate therefore forms a capacitor. The strip of polysilicon gate material is elongated and has an inherent resistance. Therefore for each portion of the polysilicon gate and the corresponding portion of the substrate, such portions introduce an inherent RC delay. In an approximation, each N-transistor 12 and each P-transistor 18 may be represented by the circuits respectively in cells 12', 18' in FIG. 2. Thus the portion of the polysilicon gate 14 between regions 24, 26 and regions 24, 26 are equivalent substantially in function to FET 52 and resistor 62 of FIG. 2. Similarly the strip of polysilicon gate 14 between regions 26, 28 and the two regions 26, 28 are substantially equivalent in function to transistor 54 and resistor 64. The short strip of polysilicon material 14' of FIG. 1 is substantially equivalent in function to resistor 72. It will be understood, however, that functional representations of the device 10 other than that shown in FIG. 2 is possible. Since the representation 10' of FIG. 2 is believed to be adequate for illustrating the invention, other functionally equivalent representations are not shown.

As in device 10, the drains of the transistors in device 10' are connected to the pad 16' and their sources tied to rails $V_{ss}$ or rail $V_{DD}$. Signals are fed at nodes PGATE, NGATE to the gates of the transistors and the output of device 10' is at pad 16' for driving loads connected thereto.

Figure 4:
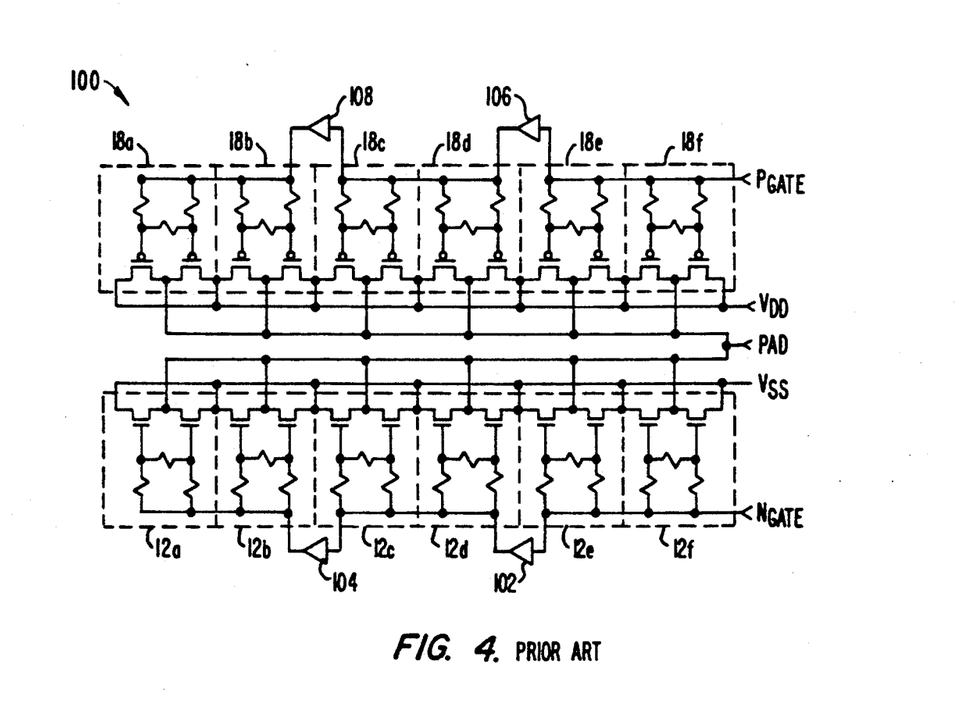
FIG. 4 is a schematic circuit diagram of an output device modified from that of FIG. 2 to illustrate a conventional slew-rate control scheme.

FIG. 4 is a schematic circuit diagram of an input/output device in which a conventional scheme for slew-rate control is implemented. The device of FIG. 4 is the functional equivalent to a device with a schematic similar to that in FIG. 1 as explained below. From FIGS. 2 and 4, it will be evident that circuit 100 of FIG. 4 is essentially the same as circuit 10' of FIG. 2 except for one important difference described below.

In circuit 10' of FIG. 2, the gates of the N-type transistors 52, 54 are all connected to the same signal at NGATE through resistors such as resistors 62, 64. Therefore, a signal applied to NGATE will switch on or off all of the N-transistors in the cells 12'. In circuit 100 of FIG. 4, however, this is not the case. Thus while the gates of the N-type transistors in transistor cells 12e, 12f are connected to NGATE through resistors only, the gates of transistors in cells 12c, 12d are connected to NGATE through delay element 102 as well as resistors. The gates of transistor cells 12a, 12b are connected to NGATE through two delay elements 102, 104 as well as resistors. In other words, when a signal is fed to NGATE, transistors in cells 12e, 12f are turned on first, followed by transistors in cells 12c, 12d after a certain delay introduced by delay element 102, and then followed by transistors in cells 12a, 12b which are delayed relative to transistors in cells 12e, 12f by a delay determined by the total delay of delay elements 102, 104. For simplicity in discussion, the transistor cells 12a-12f, 18a-18f will simply be referred to as transistors 12a-12f, 18a-18f since they are the functional equivalent of transistors implemented in the manner illustrated in FIG. 1.

The P-channel transistors 18c, 18d are switched on later than transistors 18e, 18f by a delay introduced by the delay element 106. P-channel transistors 18a, 18b are switched on later than transistors 18c, 18d by a delay introduced by the combined delay of delay elements 106, 108. Since the N-channel and P-channel transistors 12a-12f and 18a-18f form pairs of pullup and pulldown transistor pairs, it is preferable for delay elements 102, 106 to introduce substantially the same amount of delay and for delay elements 104, 108 to introduce substantially the same amount of delay. In such manner, the transistor pairs will be switched on and off at essentially the same time.

In reference to FIG. 2, since all the transistors 12', 18' are switched on or off at essentially the same time, the switching currents through the transistors will increase and decrease at essentially the same times causing transition abruptness and large peak switch in currents. In reference to FIG. 4, since transistors 12c, 12d, 18c, 18d are turned on later than transistors 12e, 12f, 18e, 18f, and since transistors 12a, 12b, 18a, 18b are switched on or off at still later times, the switching currents in the six transistor pairs do not increase or decrease at the same time, thereby reducing rate of change of the total current and reducing the peak current of switching. This is illustrated, for example, in reference to FIGS. 5 and 6.

Figure 5:
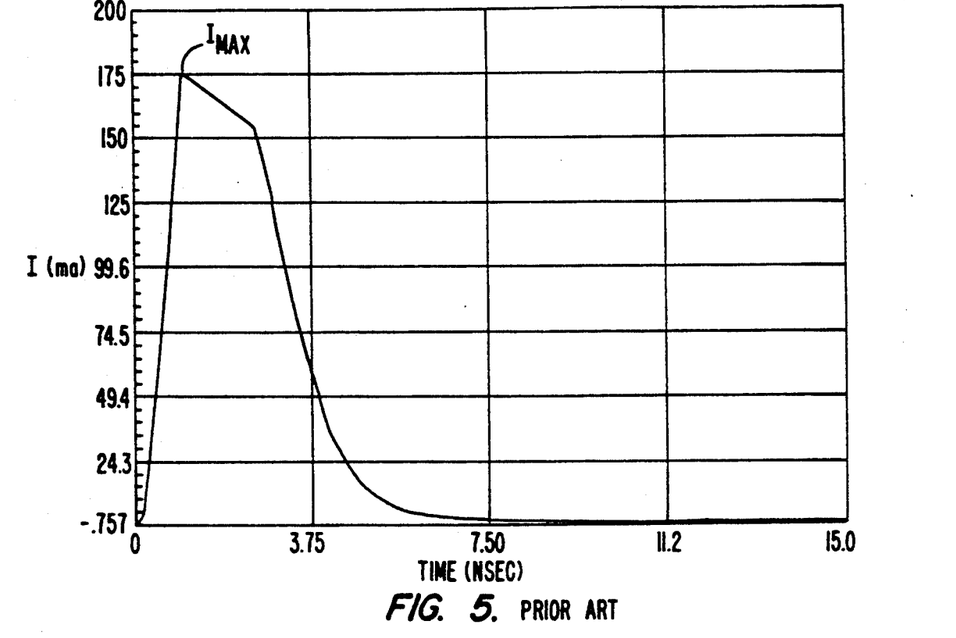
FIGS. 5 and 6 are graphical illustrations of the switching current in the output devices of FIGS. 2 and 4 to show the effect of slew-rate control.
Figure 6:
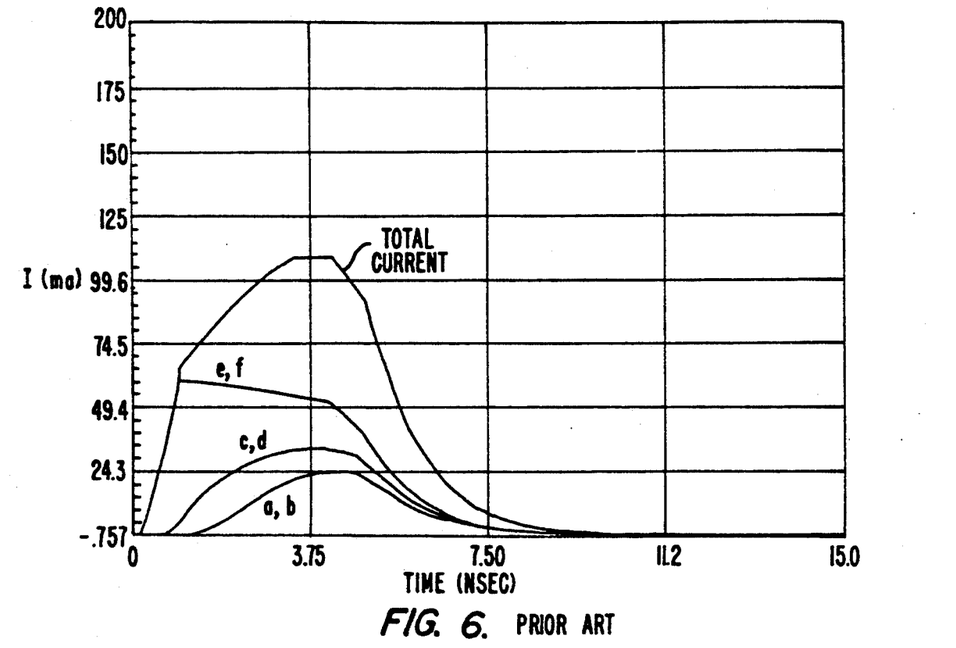

FIG. 5 is a graphical illustration of the switching current as a function of time in device 10' of FIG. 2 employing no slew-rate control. As is evident from FIG. 5, the switching current in device 10' increases rather abruptly to a large peak value $I_{max}$, decreases at an essentially linear rate for a short time and then drops off just as abruptly. FIG. 6 is a graphical illustration of the switching current in device 100 of FIG. 4. The graph labelled e,f represents the current through transistors 12e, 12f, 18e, 18f. The curve labelled c,d indicates the switching current through transistors 12c, 12d, 18c, 18d and the curve labelled a,b represents the switching current through transistors 12a, 12b, 18a, 18b. As is shown in FIG. 6, the switching current in transistors 12e, 12f, 18e, 18f rises rapidly but the switching current in transistors 12c, 12d, 18c, 18d rises at a later time and that in transistors 12a, 12b, 18a, 18b rises at a still later time. Furthermore, only the switching current in transistors 12e, 12f, 18e, 18f reaches its peak value in a short time and begins to fall, at first essentially linearly and then drops off. The switching current in transistors 12c, 12d, 18c, 18d never reaches its maximum permissible under the circuit conditions and actually falls before the permissible peak is reached. The switching current through transistors 12a, 12b, 18a, 18b rises to a still lower level before they also drop. The pad voltage applied to the drains of these transistors 12a, 12b, 12c, 12d, 18a, 18b, 18c, 18d prevents the switching current in these transistors from reaching the maximum value. Consequently, the total current through device 100 shown in FIG. 6 as the curve in solid line rises less abruptly compared to the switching current in device 10' of FIG. 2. Furthermore, the peak value of the switching current $I_{max}$ in device 100 is much lower than that in device 10' of FIG. 2. Consequently, device 100 with slew-rate control introduces less noise than device 10' with no slew-rate control.

While device 100 is advantageous over device 10' for the reasons described above, the slew-rate control scheme in device 100 is not entirely satisfactory. Thus, delay elements 102-108 occupies valuable area in input-/output devices. This area penalty and the routing associated with the delay element become costly in submicron technology.

Figure 7:
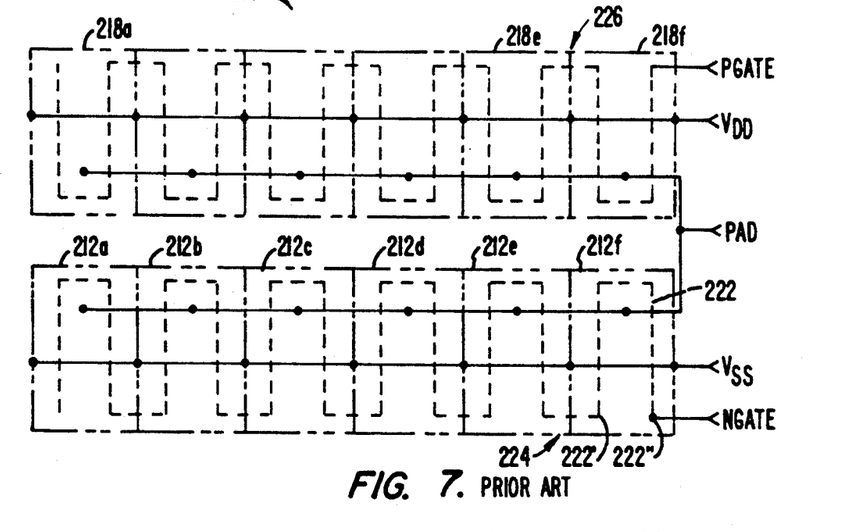
FIG. 7 is a schematic layout of a conventional output semiconductor structure with slew-rate control.

FIG. 7 is a schematic layout of a prior art input/output semiconductor structure with slew-rate control. A comparison of device 10 in FIG. 1 to device 200 in FIG. 7 will reveal that the two devices are similar in structure except that in each transistor of device 200, the polysilicon gate is an elongated strip of material in the shape of three sides of a rectangle so that the strip has two ends not connected to each other. Thus, in transistor 212f of FIG. 7, for example, the two ends 222' and 222" of polysilicon gate 222 are not connected to each other. Also note that the gate of transistor 212f is connected to the gate of transistor 212e through an extension of the polysilicon strip 224. In effect, the gates of transistors 212f and 212e are connected through a polysilicon layer similar to the gate layers of the two transistors to form one continuous layer.

Thus a signal applied to NGATE will travel along the gate of transistor 212f and through the polysilicon strip 224 before reaching the gate of transistor 212e. This has the important effect of introducing a RC delay between the node NGATE and transistor 212e. As explained above in reference to FIG. 3, polysilicon gate 222 together with the substrate and the insulating layer (not shown in FIG. 7), form a capacitance and the long strip of polysilicon material in gate 222 forms a resistor, thereby introducing an RC delay. Hence such structure of transistor 212f introduces an RC delay between the node NGATE and transistor 212e.

Figure 8:
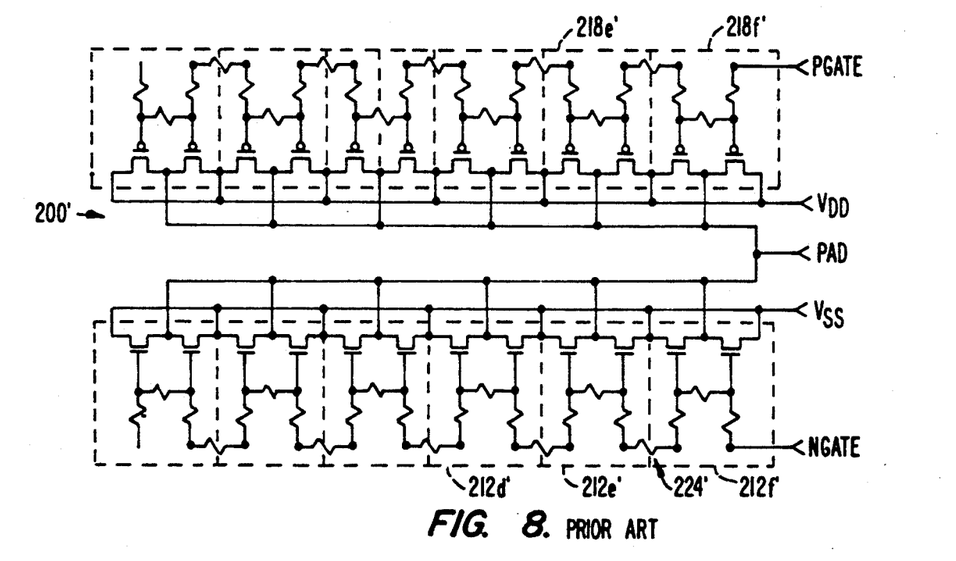
FIG. 8 is a schematic circuit diagram of an output device equivalent in function to that of FIG. 7.

Therefore when a signal is applied to NGATE, transistor 212f will be switched on or off before transistor 212e by a delay determined by the RC delay introduced by transistor 212f as explained above. Similarly, when transistor 212e has a similar structure as transistor 212f, transistor 212d will be switched on or off after transistors 212f and 212e by a delay determined by the RC delays introduced by transistors 212e, 212f. The same effect can be seen from the equivalent circuit 200' of FIG. 8. As explained earlier in reference to FIGS. 1 and 2, circuit 200' is equivalent approximately in function to circuit 200 of FIG. 7. As shown in FIG. 8, a signal applied to NGATE will be delayed by the RC effects of transistor 212f composed of three resistors and two transistors and by the resistor 224' between transistor 212f and transistor 212e'.

In reference to FIG. 7, a signal applied to PGATE will be delayed by the RC delay introduced by transistor 218f and polysilicon strip 226 before transistor 218e will be switched on or off. Therefore, transistor 218e will be switched on or off after transistor 218f by a delay introduced by transistor 218f and polysilicon strip 226. The N-channel and P-channel transistors further downstream from NGATE and PGATE will of course be further delayed by the RC effects of the transistors and polysilicon strips upstream. This is therefore equivalent to introducing delay elements between each pair of adjacent transistors without actually having to implement the delay element as in FIG. 4. Thus, the design of FIG. 7 is advantageous over that of FIG. 4 in that no additional area is required to introduce the delay. The device structure of the transistors themselves is designed to introduce such delay inherently, without requiring any additional outside elements at all. This saves expensive real estate in the semiconductor medium particularly in submicron technology where the area available to input/output devices is limited. Typical RC delays introduced by the transistors and strips themselves vary from 0.1 nanosecond to over 1 nanosecond depending on the individual transistor size, polysilicon resistivity and process characteristics.

Circuit 200 of FIG. 7 has the drawback that the slew rate is not independent of the DC output current drive capability. That is, the only way to vary the slew rate is to add or delete transistors. This is restrictive of the overall device design because the number of individual transistors making up a device also determines the current drive capability of the device.

An N-type transistor such as 212a will typically sink 1 mA. Six such transistors 212a–f will be able to sink six times as much current or 6 mA. Similarly for the P-type transistors 218a–f, the current sourcing ability of the device is determined by the number of P-type transistors that will ultimately be switched on in response to the signal at PGATE.

The design of output buffers often requires that both the current drive capability and the slew rate be independently variable. The circuit 200 does not allow the current drive capability and the slew rate to be designed independently of each other because both the current drive and the slew rate are determined uniquely by the number of transistors. This limitation of the prior art devices is overcome in the present invention.

In the present invention, the drive current and slew rate can be designed independently. The current requirements of the device are determined first. This requirement fixes the number of pull up and pull down transistors, P-type and N-type, respectively, to be used in the device. Then the desired slew rate is implemented by "tuning" the RC delay along the gates comprising the semiconductor strip by adding metal straps between some or all of the gates. Since the metal will conduct with negligible delay per unit length compared to the semiconductor strips, the slew rate will be increased by adding metal straps.

Figure 12:
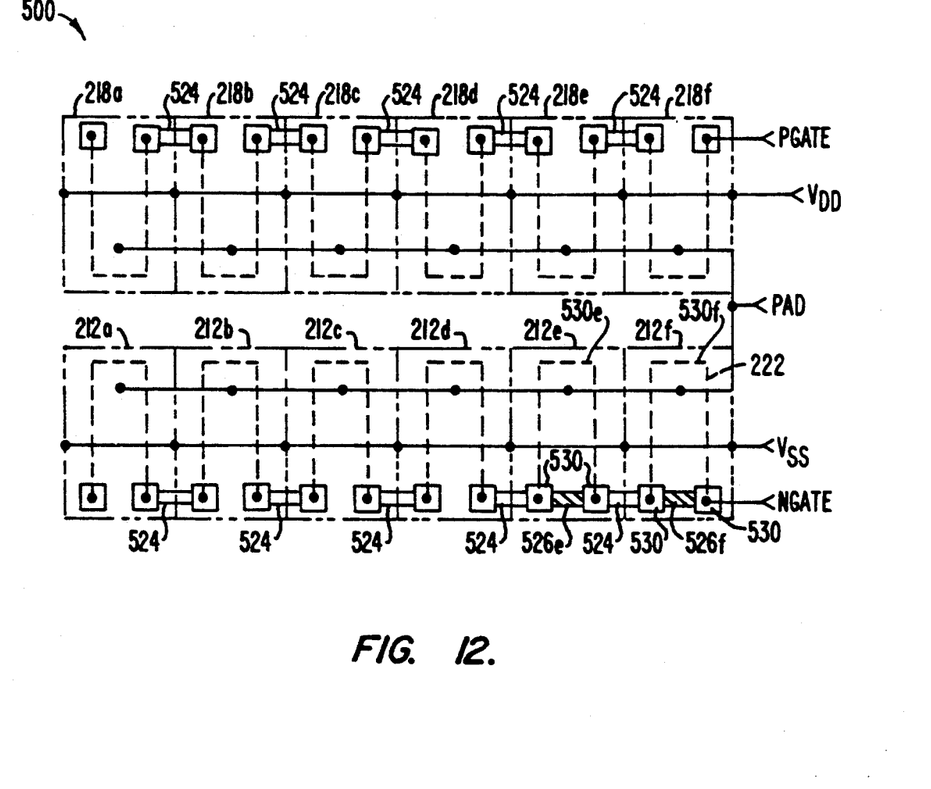
FIG. 12 is a schematic layout of slew-rate control using metal straps to illustrate the invention.

FIG. 12 shows the input/output semiconductor structure of FIG. 7 with the addition of the metal straps of the present invention. In FIG. 12, the serpentine gate 222 has been provided with metal straps 524. Metal straps 524 are across that portion of the polysilicon strip 222 which connects adjoining transistor gates and will be called "joining" straps. The effect of joining straps 524 is to diminish the RC delay inherent in the serpentine gate by about 20 percent since the amount of the serpentine gate replaced by joining straps is approximately 20 percent. Even though this limits the range of possible RC delays that can be achieved with the metal straps (the maximum RC delay is lowered by 20 percent), this is a relatively small effect on the RC delay which can be compensated for in other ways, e.g., by increasing the gate RC delay by changing the dimensions of the gate, by changing the doping of the gate or by other means.

Further, the pre-design of the joining straps 524 allows for more efficient addition of later straps, to be explained below.

Additional metal straps 526e and 526f are shown across transistors 212e and 212f, respectively, of the NGATE side of the device. Each of these metal straps 526e and 526f serves to short or bypass the RC delay inherent in the transistor gates 530e and 530f, respectively. Straps such as 526e and 526f are referred to as "bypass" straps. With bypass straps 526e and 526f in place, transistor 212d will "see" the signal at NGATE without any significant delay. Similarly, the transistor 212e will see the signal at NGATE without the delay it would have seen had bypass strap 526f been absent.

The existence of bypass strap 526e across the U-shaped gate of transistor 212e, in addition to eliminating the delay due to gate 530e to transistor 212d, also provides that the signal at NGATE is applied to both ends of the U-shaped gate 530e of transistor 212e. Also, metal strap 526f results in the application of a signal at NGATE to both sides of the transistor gate 530f of transistor 212f. Because the signal is applied to both ends of the gates in transistors 212e and 212f, they will turn on in approximately one quarter of the time it would otherwise take had straps 526e and 526f been absent. So, the effect of adding straps 526e and 526f not only eliminates the RC delay to subsequent transistors in the chain, but also causes the transistors across which the straps are placed to turn on more quickly.

Contact pads 530 are already in place, having been used to attach joining straps 524 to the serpentine gate. In one method of design, the contact pads 530 and joining straps 524 are designed as structures in a "base cell" which contained in a computer database. "Overlays" which are additional computer data that contain the designs for bypass straps such as 526e and 526f are merged with this base cell to create the completed transistor chain. By building the transistor chain in this way the work is minimized, there is no duplication of information and the risk of error is reduced. Thus, this "predesign" of contact pads 530 and joining straps 524 provides that the design considerations for implementing additional bypass straps 526e and 526f are minimal. A useful structure is achieved by providing bypass straps such as 526e and 526f across the two ends of the U-shaped gates of all the transistors (for bypassing the RC delays of all of the transistors), but where each strap has a fuse therein. Thus a user can choose to retain the RC delay provided by any one of the transistors by "burning" the fuse in the bypass strap which short-circuits the gate of such transistor. Means for programming other than fuses may also be used to achieve the same result and are within the scope of the invention; such other programming means are described below.

Straps 526e, 526f may also be polysilicon strips designed to introduce a smaller RC delay than that of the transistor gates. Where it is desired to have the maximum range of selectable RC delay, joining straps 524 need not be used. Instead, polysilicon strips can be used to connect adjoining transistors.

Figure 10:
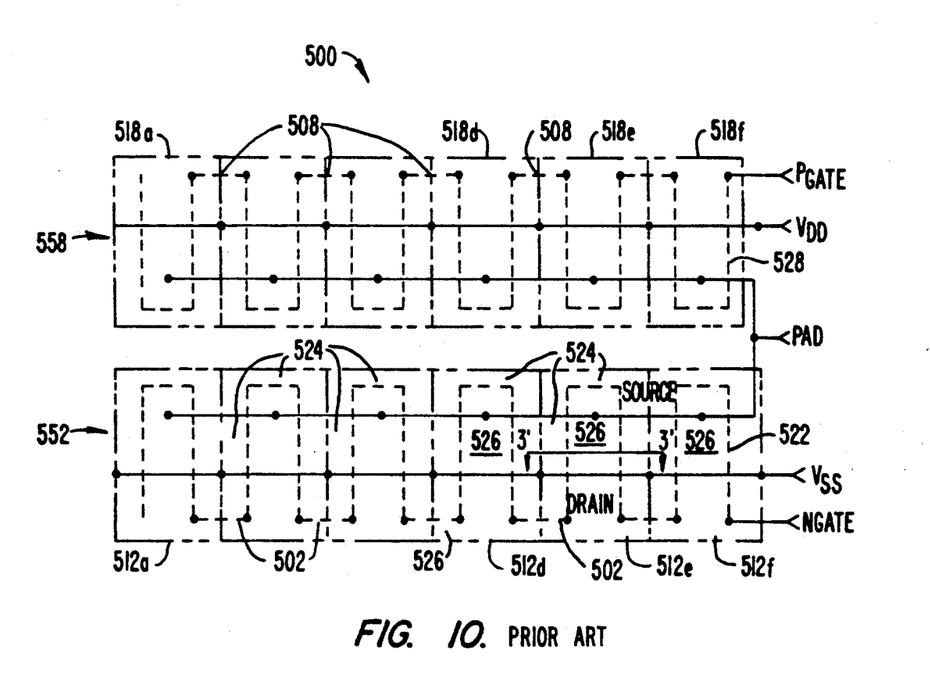
FIG. 10 is a schematic layout of an output semiconductor structure with conventional slew-rate control.

It is also possible to have the joining and bypass straps configurable by the end user by providing a means, such as fuses (not shown in figures), whereby the user could selectively "burn" open the bypass or joining straps to achieve a desired slew rate or dc output drive current capability. It is also possible to provide joining straps overlying a polysilicon strip portion, such as 502 in FIG. 10, which connects the adjoining gates of transistors 512d and 512e. Then, when the overlying joining strap is burned away, the polysilicon strip 502 would be remaining to provide a continuous chain of gates and a greater RC delay.

Figure 13A:
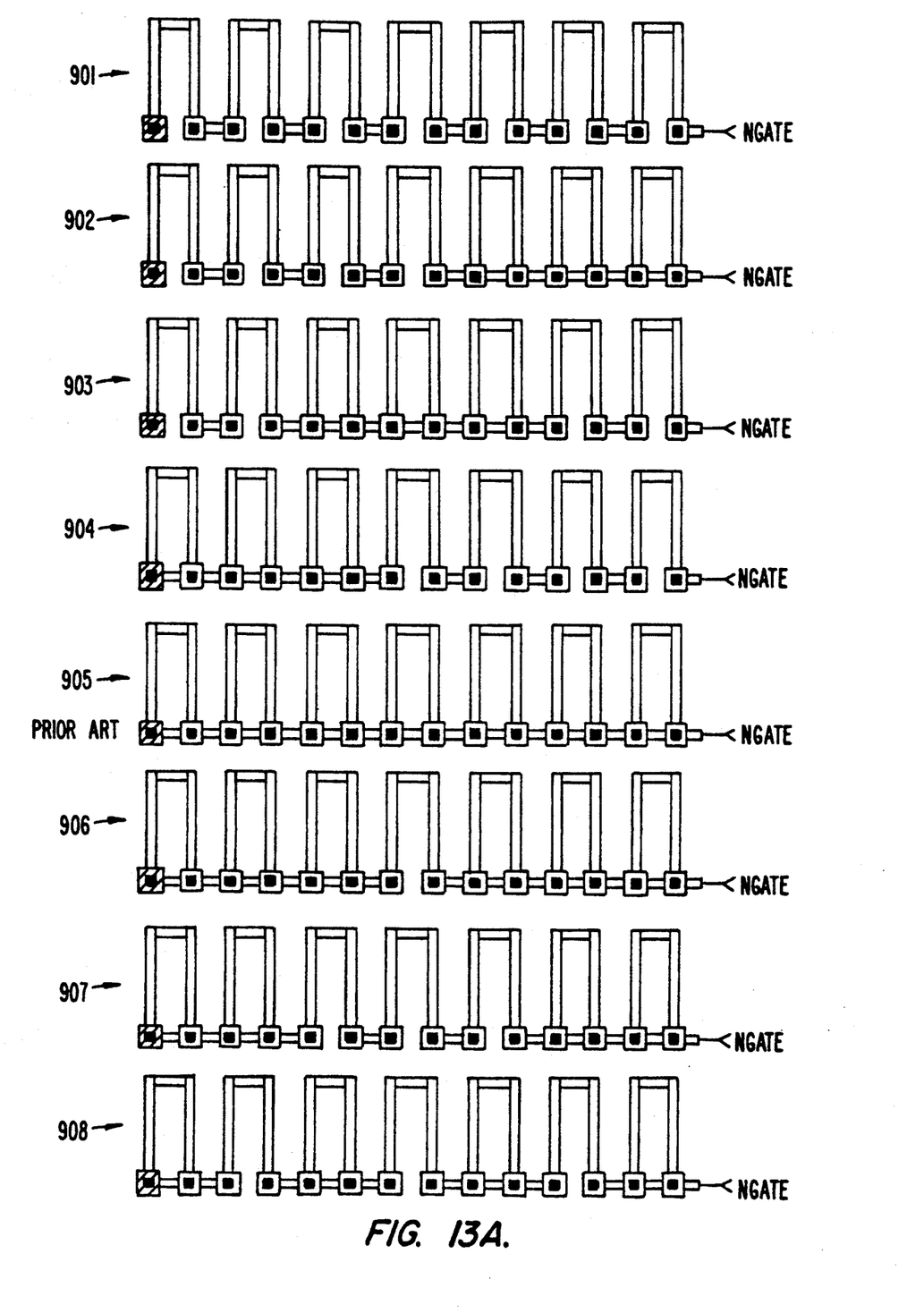
FIG. 13 is a graphical illustration of the switching current in the invention as illustrated in FIG. 12 to show the effect of slew-rate control.

FIG. 13A shows several chains of transistors for driving the input at NGATE. Each chain may be thought of as the chain at the NGATE side of the circuit 500 in FIG. 12. FIG. 13A shows eight transistor chains 901-908. Each chain includes seven transistors instead of six transistors as shown in FIG. 12. This discrepancy is merely due to the computer simulation model used and the results obtained are similar to the case with six transistors.

Transistor chain 901 shows the chain as it would appear without bypassing straps added to the chain. The only metal straps shown in 901 are the joining straps across the serpentine gate portion that connect adjoining transistors.

In chain 902 of FIG. 13A, bypass straps have been added across the gates of the three right-most transistors. Similarly, in chain 903, bypass straps have been added across the gates of the middle three transistors, with the rest of the transistor gates in chain 903 being left open or unbypassed. Chain 904 has the left-most three transistor gates shorted by bypass straps.

Chain 905 shows the case where all of the transistor gates have been shorted by bypass straps. In chain 905, all of the transistors are in parallel and the result is the prior art device of FIG. 1, with the difference that there are seven transistors instead of six in the chain. While FIG. 13A only shows transistors on the NGATE side, the use of joining straps and bypass straps can be used similarly on the PGATE transistors.

Figure 13B:
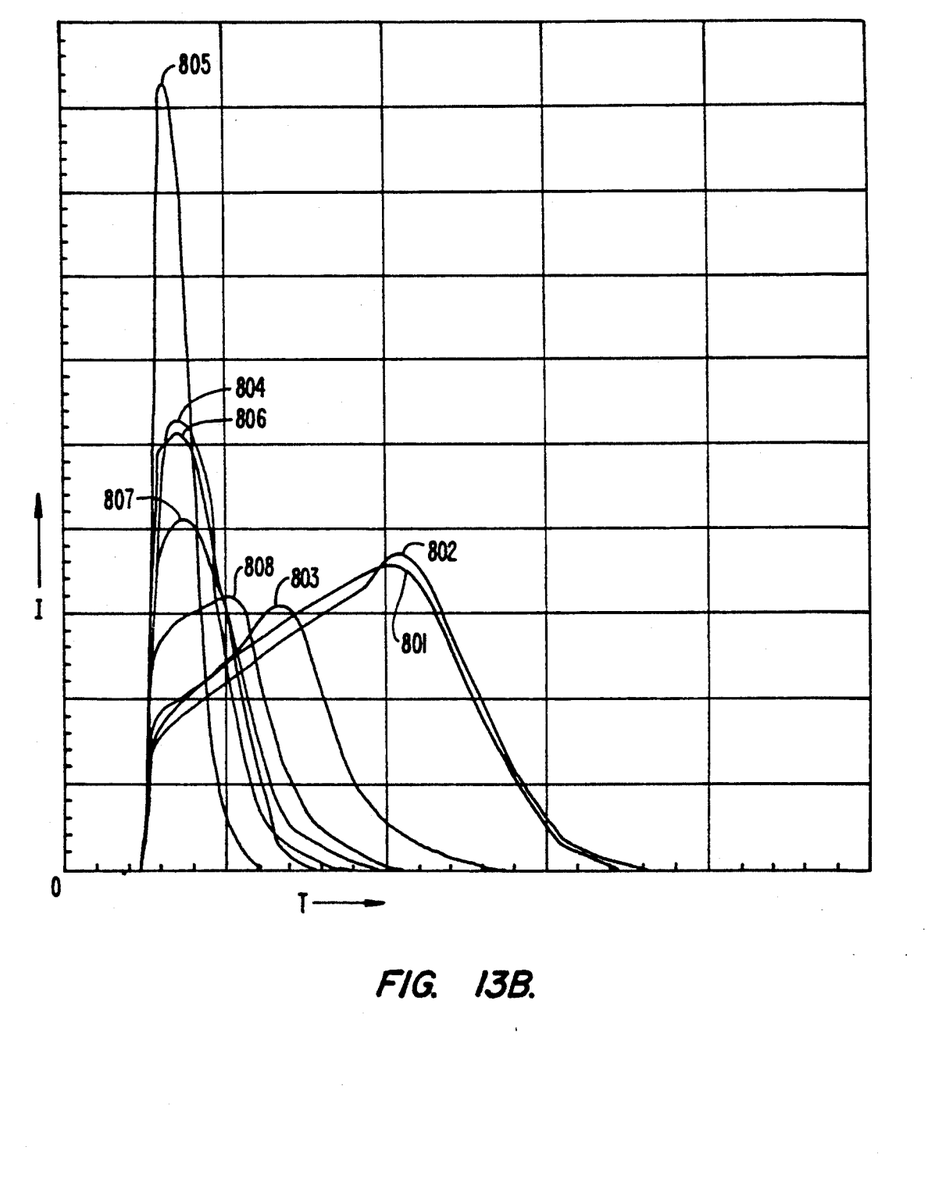

FIG. 13B shows the switching current for different chains of FIG. 13A with respect to time. The graph in FIG. 13B is similar to the graph of FIG. 6, which showed the switching current for a prior art transistor device.

In FIG. 13B, for example, curve 801 corresponds to FIG. 13A chain 901. Curve 802 of FIG. 13B corresponds to chain 902 of FIG. 13A, and so on. It can be seen from FIG. 13B that curve 801 corresponding to chain 901, which is the transistor chain having none of the individual transistor gates bypassed by metal straps, produces a curve with the lowest slew rate. Curve 805 of FIG. 13B corresponds to chain 905 of FIG. 13A, which is the case where all of the transistor gates are shorted, thus producing the output curve with the highest slew rate and highest peak current.

The other curves in FIG. 13B, that is, 802, 803, 804, 806, 807 and 808, correspond to intermediate cases of transistor chains 902, 903, 904, 906, 907 and 908 which have slew rates between curves 801 and 805. Varying the position and number of bypass straps across the transistor gates has varying effects on the slew rate and peak current output.

Thus, it is seen that a designer would be able to change from any of the slew rate curves of FIG. 13B and implement this curve in a device simply by specifying which transistor gates are to be shorted via bypass straps. As mentioned before, implementing variable RC delay by means of adding metal straps has virtually no downside in terms of using excess substrate area or in terms of having to balance the computation of interdependent DC output current drive and slew rate requirements. Use of the invention results in more efficient design and fabrication of integrated circuits.

While the invention is illustrated by means of CMOS devices, it will be understood that the invention is applicable to other types of devices as well, such as NMOS or HMOS devices. While six or eight pairs of transistors are shown in many of the figures, it will be understood that the scheme of this invention is applicable whenever there are two or more transistors arranged such as transistor 518e and 518f of FIG. 12. If less delay is desirable for the overall design of the device, some of the transistors may have gates in the shape of a closed rectangular loop similar to those of FIG. 1. All such variations are within the scope of the invention. Adjacent transistors are preferably implemented on the same semiconductor substrate.

Figure 9:
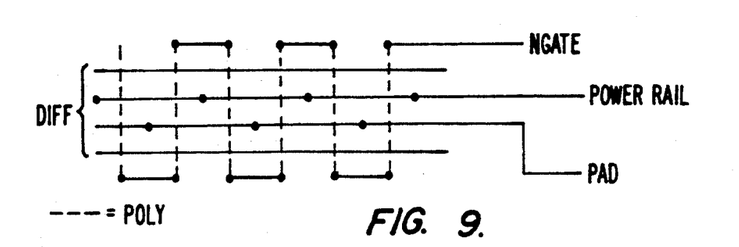
FIG. 9 is a schematic diagram showing the layout of an output semiconductor structure employing conventional slew-rate control, where the polysilicon gates of the transistors in the structure have shapes different from those of FIG. 7.

While in the preferred embodiment of FIG. 12 the shape of the polysilicon gates of each transistor is shown having the shape of three sides of a rectangle, it will be understood, however, that the shape of the polysilicon gates of the transistors may take on other possible shapes as well, such as straight lines as shown in FIG. 9. As shown in FIG. 9, the polysilicon gates are shown as dotted lines and the gates of different transistors are connected by metal connections which are shown as solid lines. Obviously polysilicon gates of other shapes may also be used as well.

Figure 11:
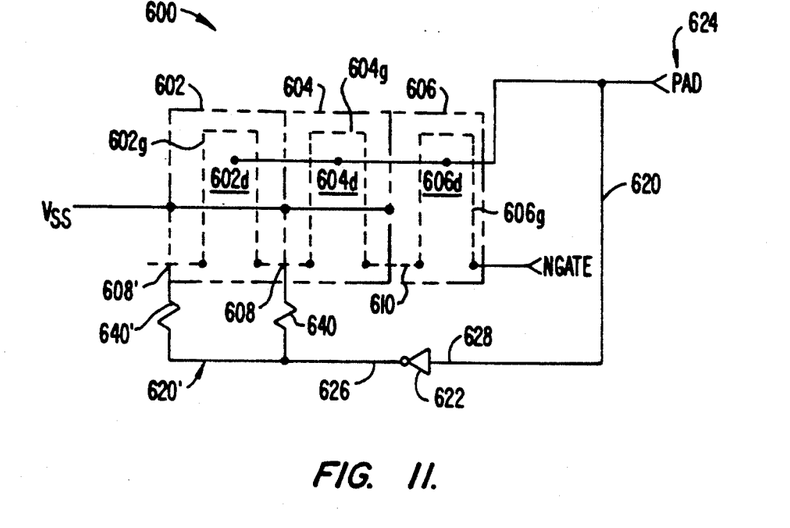
FIG. 11 is a schematic layout of an output semiconductor structure with slew-rate control using metal straps and feedback to illustrate the invention.

Feedback may be employed to provide slew-rate control as shown in FIG. 11. As shown in FIG. 11, structure 600 includes 3 MOSFETs 602, 604 and 606 whose drain regions 602d, 604d, 606d are connected to an output pad. As before, each of the three transistors has a gate in the form of a polysilicon strip of material (602g, 604g and 606g). The gates of transistors 602, 604 are connected by another strip of polysilicon material 608 serving as a resistor. Whereas the gates of transistors 604, 606 are connected by a metal strip 610. A feedback path 620 is provided from the pad to a selected point on the polysilicon strip 608 where the feedback path includes an inverter 622.

Thus when a switching signal is fed to the NGATE, transistor 606 is switched on before transistors 602, 604. This is the case since the signal to the gate of 604 is delayed by the RC delay introduced by transistor 606, and the signal to the gate of transistor 602 is delayed by the RC delays of transistor 604, 606 as before. In addition, the switching is further delayed by the feedback action provided by the feedback path 620. Again a fuse 640 in the feedback path provides programmable means by which a user may disable the feedback path by burning the fuse. This is particularly useful where a number of feedback paths are provided to different points or nodes (e.g., 608, 608') between transistors, each feedback path having a fuse to permit a user to select the desired feedback path that is left intact. Thus paths 620, 620' of FIG. 11 with fuses 640, 640' would permit a user to choose one of the two paths by "burning" the fuse in the other path.

In FIG. 11 the feedback action is implemented by detecting a voltage level at the pad 624 by the use of a logic gate. The logic gate is an inverter 622 which will change the state of its output 626 from a low voltage to a high voltage when the signal at its input 628 is changing from a high to a low and goes through the inverter's input threshold voltage. A typical value for the input threshold voltage of a balanced inverter is 2.5 volts.

Figure 14:
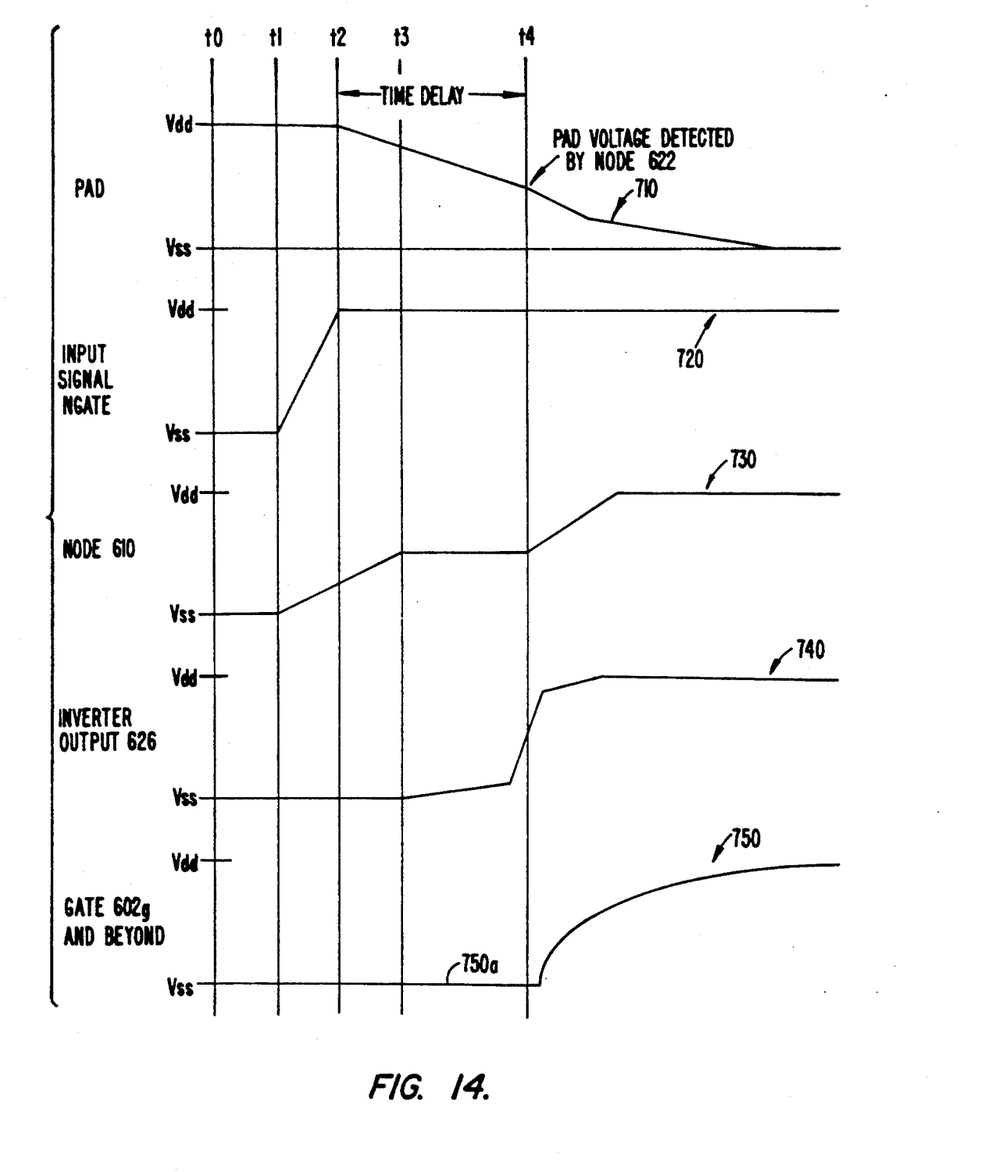
FIG. 14 is a set of graphs to illustrate the voltages with change in time for the circuit of FIG. 11.

FIG. 14 is a timing diagram of the signals in the circuit of FIG. 11 where it is assumed that fuse 640' is burned, leaving intact path 620. The following discussion relates to both the circuit of FIG. 11 and the graphs 710, 720, 730, 740 and 750 of FIG. 14. The input signal at NGATE is shown by curve 720. At time t0, NGATE is initially at a logic low, or Vss. The transistors 602, 604 and 606 of FIG. 11 are thus off. Since the signal at PGATE will also be low, the P-transistors in the PGATE chain will be turned on and the signal at PAD is pulled high to Vdd by the pull up P-transistors (not shown).

At time t1 the signal at NGATE begins changing to logic high. Although not shown, the signal at PGATE will also begin changing from logic high to logic low. The P-transistors will be turned off as the N-transistors are turned on so that the signal at PAD will be released from the pull up P-transistors to be pulled low by the pull down N-transistors.

At t2, the signal at PAD begins to be pulled low by transistor 606 being turned on. This is shown on curve 710 by the linear decline of the signal at PAD beginning at time t2. As the current through transistor 606 propagates along the serpentine semiconductor gate 606g, the voltage at node 610 which is connected to the end of gate 606g begins to rise. But the voltage at node 610 will be limited in its rise as long as the voltage at node 608 is held low by the output of the inverter 622 functioning as a detector. Node 610 is actually held somewhere between the voltages at node 608 and at NGATE because node 610 is essentially in a resistor divider network formed by the semiconductor gates 604g and 606g.

In FIG. 14, this voltage is about half of (Vdd-Vss) since the inverter output is at Vss and NGATE is at Vdd and node 610 is on the semiconductor gate midway between NGATE and node 610. This is shown by the flat part of the curve 730 in FIG. 14 starting at time t3. Also, any transistors beyond node 608 will not begin turning on as long as node 608 is held low by the inverter 622. This is shown by the flat portion 750a of curve 750 labelled "Gate 602g and beyond" of FIG. 14.

At time t4, the voltage at PAD drops below the inverter 622 threshold. Inverter 622 changes its output 626 from low to high as shown in FIG. 14 curve 740. Thus, at time t4, node 610 begins to rise and transistor 602 and any subsequent transistors can be turned on.

As shown in FIG. 14 curve 710, the feedback circuit is responsible for slowing the slew rate between the times t2 and t4. Note that in FIG. 11, the placement of the feedback node 608 at any point along the continuous semiconductor strip is possible thereby allowing for flexibility in designing for different slew rates. In practice, feedback node 608 will be located at one of the "bottoms" of the U-shaped transistors because the size restrictions of the transistors generally only allow metal contacts to the gate to exist in that region. However, with different transistor designs it may be possible to attach the feedback node to any point on the semiconductor strip. Also, the time delay can be lengthened or shortened by selecting the appropriate input voltage detection threshold of the inverter 622. For FIG. 11, the closer the voltage threshold is to Vss the longer will be the time delay. The closer the threshold is to Vdd the shorter will be the time delay.

The feedback circuit of FIG. 13 may be used for the P-transistors as well. If applied to the P-transistor gates, moving the input voltage detection threshold of the inverter towards Vss will shorten the time delay, while moving the threshold of the inverter closer to Vdd will lengthen the delay.

The use of feedback in controlling the delay provides many advantages. The designer, in addition to adjusting the input voltage detection threshold, can tap into any one or more locations on the serpentine gates. The P and N transistors are usually quite different in size. This means that the P and N transistors will have different RC delays. Separate logic gates can be used for feedback control to the P and N transistor output drivers, tailored for each as needed.

Other devices well known in the art may be used to implement the detector function performed by inverter 622. For example, the detector can be a complex level shifter for precise voltage and time control, or logic gates that could be controlled by the system in which the chip has been placed to detect different voltages for different loading conditions or noise control needs. It is also possible to have an input to a logic gate being used as a detector that disables slew rate control entirely.

As described above, programmable means are provided in connection with feedback control so that the user may select any number of feedback paths connected to different points of the transistor gates chain to affect the slew-rate. Programmable means has also been provided by which the user may select which bypass metal straps should remain intact to achieve the desired slew-rate. In both cases, such programmability is provided by means of fuses. Once burnt, however, the disconnected paths cannot be reconnected easily. For this purpose, it may be desirable to provide a more flexible programmable means. This is illustrated in FIG. 15.

Figure 15:
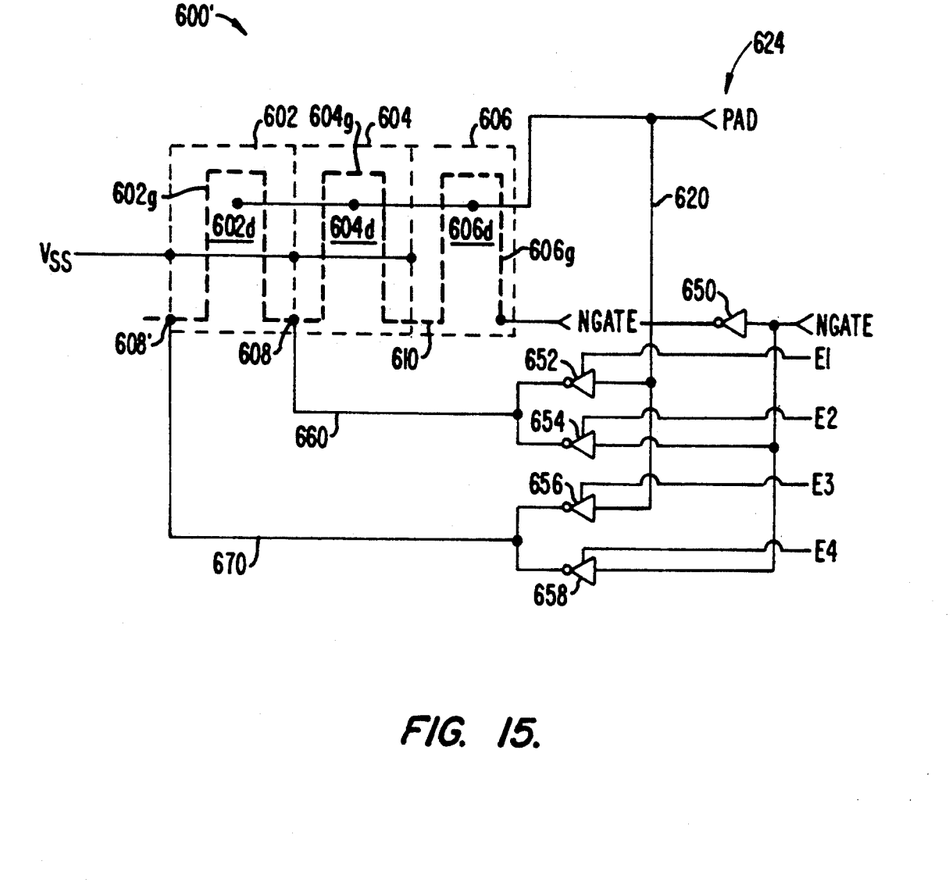
FIG. 15 is a schematic layout of an output semiconductor structure with slew-rate control using metal straps and programmable feedback paths to illustrate the invention.

FIG. 15 is somewhat similar to FIG. 11 so that identical components in the two figures are labeled with the same numerals. As shown in FIG. 15, the input NGATE is derived from another input NGATE' through a buffer 650. The programmable means includes four tri-state buffers 652, 654, 656 and 658. The feedback path 620 connects the output pad 624 to the inputs of buffers 652, 656. The input NGATE' is fed to the inputs of buffers 654, 658. The outputs of buffers 652, 654 are then connected to node 608 by path 660. The outputs of buffers 656, 658 are connected to node 608' by path 670.

If the user desires to provide a feedback path from pad 624 to node 608, the signal E1 is set at logic high, thereby enabling buffer 652. Buffer 652 then connects feedback path 620 to node 608 through path 660. If instead the user wishes to provide a feedback path to node 608', the signal E1 would be set to logic low to disable buffer 652 and signal E3 is set at logic high to enable buffer 656, which then connects feedback path 620 to node 608' through path 670. Of course if the user desires to have both feedback paths active at the same time, both enabling signals E1, E3 will be at the high logic state.

The schematic lay out of FIG. 15 may also be used to simulate the function of the bypass metal straps of FIGS. 12, 13A, 13B. When structure 600' is used for such purpose, the signals E1, E3 should be at logic low to disable buffers 652, 656, which are used only for feedback control. Thus when buffer 654 is enabled by signal E2, a signal at the same state as the signal NGATE (since both are derived from NGATE') is applied directly to node 608, thereby bypassing 606 and 604 to turn on transistor 602 directly. Similarly if buffer 658 is enabled by signal E4 at the high logic state, the input signal NGATE would be applied to node 608' directly to turn on the transistors downstream from transistor 602. This has the effect of bypassing the RC delays of transistors 602, 604 and 606 altogether. The above described scheme in FIG. 15 has the advantage that unlike fuses, after programming structure 600' for one particular use, the user preserves the flexibility to electrically program structure 600' differently from before to achieve a different feedback path or bypassing different transistors in the structure.

The slew-rate control schemes of this invention have been described for use in output devices. It will be understood that the scheme may be applicable in other devices as well. While the invention has been described by means of detailed descriptions of semiconductor structures, designs and methods, such implementations are merely illustrative thereof and various changes and variations are within the scope of the invention as defined by the appended claims.

We claim:

1. A semiconductor structure comprising:
   means for applying a signal to switch the structure;
   a plurality of MOS field effect transistors whose drains are connected to an output pad, wherein the gate of each of the transistors is elongated and has a near end and a far end;
   electrically conductive means for connecting the far end of the gate of at least one transistor to the near end of the gate of each succeeding transistor thereby forming a continuous chain of transistor gates with one or more nodes between adjacent gates in the chain, the transistors with gates in the chain forming a sequence, so that when a signal is applied to the near end of the gate of a transistor in the sequence, the applied signal will propagate along the length of the gates of the transistors in the chain in the order of the sequence, so that a transistor in the sequence is switched on by the signal before a succeeding transistor in the sequence; and
   feedback means connected between said output pad and one or more nodes on said chain of transistor gates to affect the timing of the switching of the transistors.

2. The structure of claim 1, wherein said feedback means comprises an inverter.

3. The structure of claim 1, said feedback means including one or more feedback paths connecting the output pad to one or more nodes in the chain, and programmable means for enabling a user of the structure to disable said paths.

4. The structure of claim 3, said programmable means being fuses in said paths.

5. The structure of claim 3, wherein said programmable means includes logic means.

6. The structure of claim 5, wherein said logic means includes tri-state buffers.

7. The structure of claim 1, wherein the feedback means includes means to clamp one or more of the nodes on said chain of transistor gates at a first voltage when the voltage at the output pad is less than a triggering voltage, and means to clamp the voltage at one or more of the nodes on said chain of transistor gates at a second voltage when the voltage at the output pad is greater than the triggering voltage.

8. The structure of claim 1, wherein the feedback means affects the timing of the transistors by introducing a time delay in the switching of at least one of the transistors.

9. A semiconductor structure comprising:
   means for applying a signal to switch the structure;
   a plurality of MOS field effect transistors whose drains are connected to an output pad, wherein the gate of each of the transistors is elongated and has a near end and a far end;
   first electrically conductive means for connecting the far end of the gate of at least one transistor to the near end of the gate of each succeeding transistor thereby forming a continuous chain of transistor gates with one or more nodes between adjacent gates in the chain, the transistors with gates in the chain forming a sequence, so that when a signal is applied to the near end of the gate of a transistor in the sequence, the applied signal will propagate along the length of the gates of the transistors in the chain in the order of the sequence, so that a transistor in the sequence is switched on by the signal before a succeeding transistor in the sequence; and
   means for enabling a signal applied to the near end of the gate of a transistor in the sequence to bypass the gate of at least one transistor in the sequence to reduce the delay caused by the signal passing said gate.

10. The structure of claim 9, said enabling means including second electrically conductive means connecting the near and far ends of the gate of at least one but less than all of the transistors in the sequence, said second electrically conductive means having a higher electrical conductance than the gate of the at least one transistor connected by the second electrically conductive means to thereby short circuit the gate of said at least one transistor in the chain, and to thereby reduce the delay of switching of transistors in the sequence succeeding the at least one transistor.

11. The structure of claim 10, said second electrically conductive means including a metal layer.

12. The structure of claim 10, said second electrically conductive means including a plurality of electrically conductive paths each connecting the ends of one of the transistors in the sequence, and second means for enabling a user of the structure to disable at least one of said paths.

13. The structure of claim 12, said second enabling means being a fuse in said at least one path.

14. The structure of claim 9, said enabling means including means for connecting the signal applying means to the chain.

15. The structure of claim 9, said enabling means including tri-state buffers.

16. A semiconductor structure comprising:
   means for applying a signal to switch the structure;
   a plurality of MOS field effect transistors whose drains are connected to an output pad, wherein the gate of each of the transistors is elongated and has a near end and a far end;
   electrically conductive means for connecting the far end of the gate of at least one transistor to the near end of the gate of each succeeding transistor thereby forming a continuous chain of transistor gates with one or more nodes between adjacent gates in the chain, the transistors with gates in the chain forming a sequence, so that when a signal is applied to the near end of the gate of a transistor in the sequence, the applied signal will propagate along the length of the gates of the transistors in the chain in the order of the sequence, so that a transistor in the sequence is switched on by the signal before a succeeding transistor in the sequence;

electrically conductive paths connecting the near and far ends of the gate of all of the transistors in the sequence, said paths having a higher electrical conductance than the gates of the transistors in the sequence to thereby short circuit the gates of said transistors in the sequence; and programmable means for enabling a user to disable at least one of said paths, thereby permitting the user to select the desired delay of switching of transistors in the sequence.

17. The structure of claim 16, said programmable means including a fuse in said at least one path.

18. The structure of claim 16, said paths including metal layers.

19. A semiconductor structure comprising:
means for applying a signal to switch the structure;
a plurality of MOS field effect transistors whose drains are connected to an output pad, wherein the gate of each of the transistors is elongated and has a near end and a far end;

electrically conductive means for connecting the far end of the gate of at least one transistor to the near end of the gate of each succeeding transistor thereby forming a continuous chain of transistor gates with one or more nodes between adjacent gates in the chain, the transistors with gates in the chain forming a sequence, so that when a signal is applied to the near end of the gate of a transistor in the sequence, the applied signal will propagate along the length of the gates of the transistors in the chain in the order of the sequence, so that a transistor in the sequence is switched on by the signal before a succeeding transistor in the sequence;

wherein said electrically conductive means includes first and second types of paths, each path connecting the gates of two transistors in the sequence, and wherein the two types of paths have different electrical conductances.

20. The structure of claim 19, wherein said first type of paths includes metal layers and said second type of paths includes polysilicon layers.

* * * * *